(12) United States Patent
Yamasaki et al.

(10) Patent No.: US 9,133,548 B2
(45) Date of Patent: Sep. 15, 2015

(54) TiN FILM FORMING METHOD AND STORAGE MEDIUM

(71) Applicant: Tokyo Electron Limited, Tokyo (JP)

(72) Inventors: Hideaki Yamasaki, Yamanashi (JP); Shinya Okabe, Yamanashi (JP); Takeshi Yamamoto, Yamanashi (JP); Toru Onishi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/156,372

(22) Filed: Jan. 15, 2014

(65) Prior Publication Data

US 2014/0206189 A1 Jul. 24, 2014

(30) Foreign Application Priority Data

Jan. 22, 2013 (JP) .................................. 2013-009278
Oct. 2, 2013 (JP) .................................. 2013-206983

(51) Int. Cl.

| H01L 21/44 | (2006.01) |
| C23C 16/56 | (2006.01) |
| C23C 16/34 | (2006.01) |
| C23C 16/44 | (2006.01) |
| H01L 21/768 | (2006.01) |
| H01L 21/033 | (2006.01) |
| H01L 21/311 | (2006.01) |
| H01L 21/3205 | (2006.01) |
| H01L 21/321 | (2006.01) |

(52) U.S. Cl.
CPC ................. *C23C 16/56* (2013.01); *C23C 16/34* (2013.01); *C23C 16/4404* (2013.01); *C23C 16/4405* (2013.01); *H01L 21/0332* (2013.01); *H01L 21/31144* (2013.01); *H01L 21/321* (2013.01); *H01L 21/3205* (2013.01); *H01L 21/76856* (2013.01)

(58) Field of Classification Search
USPC ........................................................ 438/680
See application file for complete search history.

(56) References Cited

U.S. PATENT DOCUMENTS 5,942,282 A * 8/1999 Tada et al. ...................... 427/250
2004/0235191 A1 11/2004 Hasegawa (Continued)

FOREIGN PATENT DOCUMENTS

| JP | H06-188205 | 7/1994 |
| JP | 2003-77864 | 3/2003 |

OTHER PUBLICATIONS

Kawamura, Shigeru; Method and Device for Forming Thin Film; Abstract of JP H06-188205; Jul. 8, 1994; http://www19.ipdl.inpit.go.jp/.

(Continued)

*Primary Examiner* — Karen Kusumakar

(57) ABSTRACT

A TiN film forming method repeatedly performs for a plurality of substrates to be processed, a step of loading each substrate into a processing chamber, supplying a Ti-containing gas and a nitriding gas into the processing chamber, and forming a TiN film on a surface of the substrate by generating a plasma of the supplied gases. The TiN film forming method includes a Ti film forming step of forming a Ti film by supplying a processing gas containing Ti-containing gas into the processing chamber in a state where no substrate exists in the processing chamber after the TiN films are formed on a predetermined number of the substrates.

17 Claims, 19 Drawing Sheets

(56) References Cited

U.S. PATENT DOCUMENTS

| | | | |
|---|---|---|---|
| 2005/0136657 A1* | 6/2005 | Yokoi et al. | 438/680 |
| 2009/0142513 A1* | 6/2009 | Murakami et al. | 427/576 |
| 2011/0086184 A1* | 4/2011 | Okabe | 427/576 |

OTHER PUBLICATIONS

Hasegawa, Toshio; Film Forming Method; Abstract of JP 2003-77864; Mar. 14, 2003; http://www19.ipdl.inpit.go.jp/.

* cited by examiner

SING LAYER

MULTI LAYER

US 9,133,548 B2

TIN FILM FORMING METHOD AND STORAGE MEDIUM

CROSS-REFERENCES TO RELATED APPLICATIONS

The present invention claims priority of Japanese Patent Application Nos. 2013-009278 and 2013-206983 respectively filed on Jan. 22 and Oct. 2, 2013, which are incorporated herein by reference.

FIELD OF THE INVENTION

The present invention relates to a TiN film forming method and a storage medium.

BACKGROUND OF THE INVENTION

Recently, a Low-k film is used as an interlayer insulating film in order to decrease an inter-wiring capacitance in response to the demand for high-speed of semiconductor devices or the like. As for the Low-k film, a film having a lower k value is preferred. Thus, a porous Low-k film is used as the Low-k film, and this makes it difficult to perform etching during formation of a wiring of BEOL (Back End Of Line).

Therefore, when the Low-k is used as an etching target film, a hard TiN film having high etching resistance is used as a metal hard mask serving as an etching mask in order to improve precision of etching processing or reduce damages inflicted on the Low-k film during asking or etching.

Although a PVD (Physical Vapor Deposition) method is currently mainly used as a method for forming a TiN film used for a metal hard mask, there is also examined a CVD (Chemical Vapor Deposition) method using $TiCl_4$ gas as a Ti-containing gas and a nitriding gas (e.g., Japanese Patent Application Publication No. H06-188205) which is often used as a conventional TiN film forming method. Further, a SFD (Sequential Flow Deposition) method for alternately repeating formation of a TiN film and nitriding using $TiCl_4$ gas and a nitriding gas or an ALD (Atomic Layer Deposition) method for alternately supplying $TiCl_4$ gas and a nitriding gas (see, e.g., Japanese Patent Application Publication No. 2003-077864), which is one of the CVD method, is also examined as a method for forming a TiN film used for a metal hard mask.

The TiN film used for the metal hard mask needs to have high density. Therefore, the film formation using a plasma CVD method capable of forming a denser film is examined.

However, it has been found that when the TiN film is formed by the plasma CVD method (including the SFD method or the ALD method), the number of particles is tended to be increased after the number of substrates subjected to the TiN film formation exceeds about 150. If the number of particles is increased, the cleaning should be performed. The increase of the frequency of the cleaning leads to the decrease of the throughput.

SUMMARY OF THE INVENTION

In view of the above, the present invention provides a TiN film forming method in which the generation of particles can be suppressed during the formation of TiN films using a plasma CVD method even if the number of substrates subjected to the TiN film formation is increased. Further, the present invention provides a storage medium that stores therein a program for performing such a method.

In accordance with the present invention, there is provided a TiN film forming method for repeatedly performing, for a plurality of substrates to be processed, a step of loading each substrate into a processing chamber, supplying a Ti-containing gas and a nitriding gas into the processing chamber, and forming a TiN film on a surface of the substrate by generating a plasma of the supplied gases, the method including: a Ti film forming step of forming a Ti film by supplying a processing gas containing Ti-containing gas into the processing chamber in a state where no substrate exists in the processing chamber after the TiN films are formed on a predetermined number of the substrates.

In accordance with the present invention, while the process of forming a TiN film by plasma CVD is being repetitively performed on a plurality of substrates to be processed, the Ti film forming step of forming a Ti film by supplying a processing gas containing a Ti-containing gas into the processing chamber is executed more than once in a state where a substrate to be processed does not exist in the processing chamber after the TiN film is formed on a predetermined number of substrates to be processed. Accordingly, when microcracks that cause generation of particles are generated on the component in the processing chamber, particularly on the TiN film deposited on the surface of the gas injection member, the microcracks can be filled by the Ti film. Further, even if the number of films formed on the substrates to be processed is increased, the generation of particles can be suppressed.

BRIEF DESCRIPTION OF THE DRAWINGS

The above and other objects and features of the present invention will become apparent from the following description of embodiments, given in conjunction with the accompanying drawings, in which:

FIGS. 8A and 8B are SEM images showing a state of a film formed on a susceptor in the case of consecutively forming TiN films without performing short pre-coating after the TiN film pre-coating, wherein FIG. 8A shows a surface state and FIG. 8B shows a cross sectional state.

FIGS. 9A and 9B are SEM images showing a state of a film formed on a susceptor in the case of performing Ti film pre-coating per 25 wafers during the TiN film formation after the TiN pre-coating, wherein FIG. 9A shows a surface state and FIG. 9B shows a cross sectional state;

DETAILED DESCRIPTION OF THE EMBODIMENTS

Hereinafter, an embodiment of the present invention will be described in detail with reference to the accompanying drawings.

In the following description, mL/min is used as the unit of a gas flow rate. Since a volume of a gas varies significantly according to a temperature and an atmospheric pressure, a value converted to a standard state is used in the present invention. Further, sccm is written in parallel because the gas flow rate converted to the standard state is represented by sccm (Standard Cubic Centimeter per Minutes). Here, the standard state refers to a temperature of 0° C. (273.15K) and an atmospheric pressure of 1 atm (101325 Pa).

Figure 1:
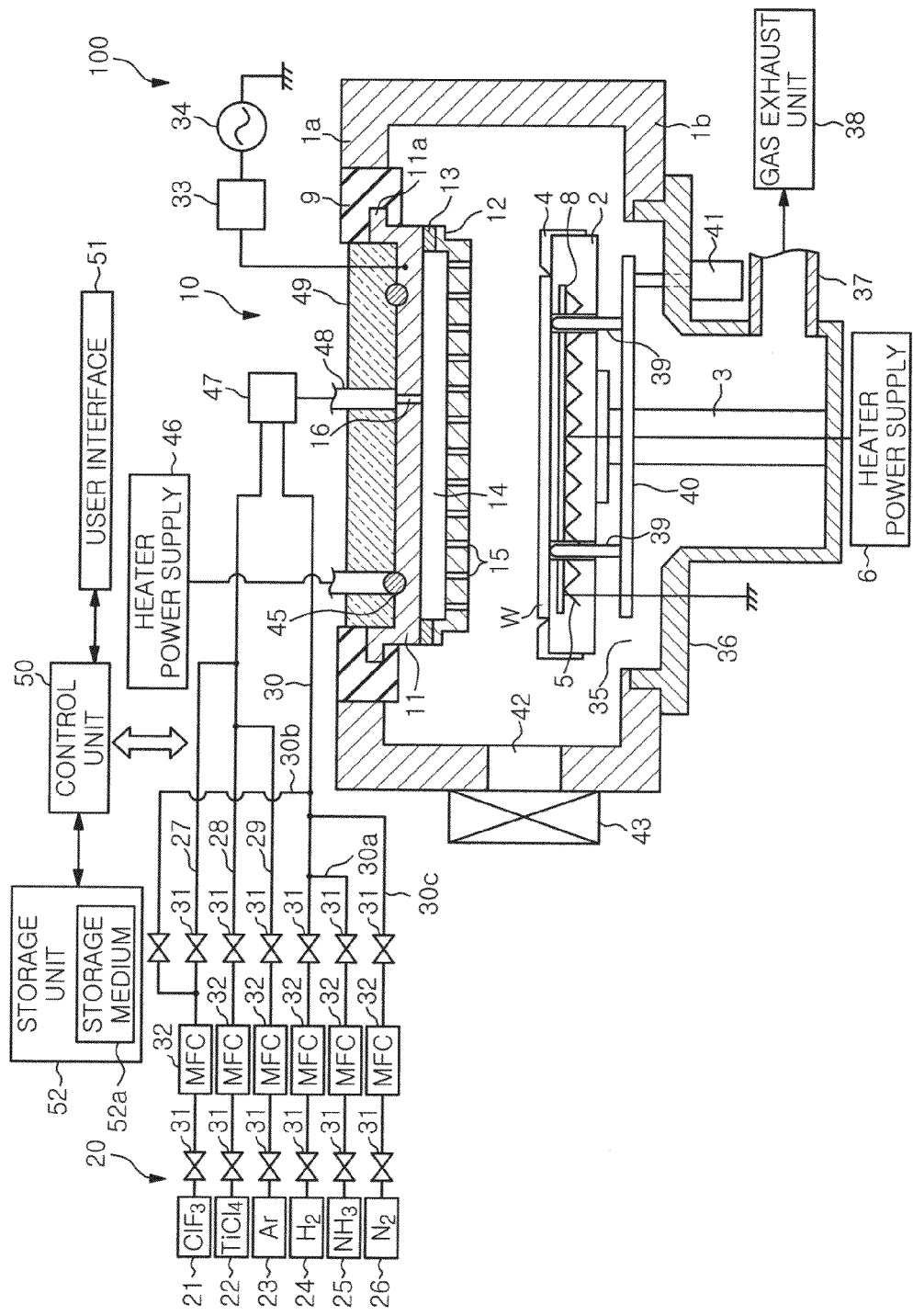
FIG. 1 is a schematic cross sectional view showing an example of a film forming apparatus used for implementing a TiN film forming method in accordance with an embodiment of the present invention.

FIG. 1 is a schematic cross sectional view showing an example of a film forming apparatus used for implementing a TiN film forming method in accordance with an embodiment of the present invention.

A film forming apparatus 100 is configured as a PECVD (Plasma Enhanced CVD) apparatus for forming a TiN film by a CVD method by generating a plasma by generating a high frequency electric field at a parallel flat electrode, and has a chamber 1 of an approximately cylindrical shape. A susceptor 2 formed of AlN is disposed inside chamber 1 while being supported by a cylindrical supporting member 3 installed at the center of the bottom portion of the chamber 1. The susceptor 2 serves as a mounting table (stage) for horizontally supporting a wafer W as a substrate to be processed. A guide ring 4 for guiding the wafer W is provided at an outer peripheral portion of the susceptor 2. Further, a heater 5 formed of a high melting point metal such as molybdenum or the like is embedded in the susceptor 2. The heater 5 heats the wafer W as a substrate to be processed to a predetermined temperature by power supplied from a heater power supply 6. An electrode 8 functioning as a lower electrode of the parallel plate electrode is installed near the surface of the susceptor 2. The electrode 8 is grounded.

A pre-mix type shower head 10 which also functions as an upper electrode of the parallel plate electrode is installed at an upper wall 1a of the chamber 1 through an insulating member 9. The shower head 10 includes a base member 11 and a shower plate 12. An outer peripheral portion of the shower plate 12 is fixed to the base member 11 by a screw (not shown) via a ring-shaped intermediate member for preventing adhesion. The shower plate 12 is formed in a flange shape and has therein a recess. A gas diffusion space 14 is formed between the base member 11 and the shower plate 12. The base member 11 has a flange portion 11a at an outer peripheral portion thereof, and the flange portion 11a is held by the insulating member 9. A plurality of gas injection openings 15 is formed in the shower plate 12, and a single gas inlet opening 16 is formed near the center of the base member 11.

Further, the gas inlet opening 16 is connected to a gas line of a gas supply unit 20.

The gas supply unit 20 includes a $ClF_3$ gas supply source 21 for supplying $ClF_3$ gas as a cleaning gas, a $TiCl_4$ gas supply source 22 for supplying $TiCl_4$ gas as a Ti compound gas, an Ar gas supply source 23 for supplying Ar gas, a $H_2$ gas supply source 24 for supplying $H_2$ gas as a reduction gas, a $NH_3$ gas supply source 25 for supplying $NH_3$ gas as a nitriding gas, and a $N_2$ gas supply source 26 for supplying $N_2$ gas. Further, $ClF_3$ gas supply lines 27 and 30b are connected to the $ClF_3$ gas supply source 21. A $TiCl_4$ gas supply line 28 is connected to the $TiCl_4$ gas supply source 22. An Ar gas supply line 29 is connected to the Ar gas supply source 23. A $H_2$ gas supply line 30 is connected to the $H_2$ gas supply source 24. A $NH_3$ gas supply line 30a is connected to the $NH_3$ gas supply source 25. A $N_2$ gas supply line 30c is connected to the $N_2$ gas supply source 26. Moreover, a mass flow controller 32 and two valves 31 having the mass flow controller 32 therebetween are installed at each of the gas lines.

The $TiCl_4$ gas supply line 28 extending from the $TiCl_4$ gas supply source 22 is connected to the $ClF_3$ gas supply line 27 extending from the $ClF_3$ gas supply source 21 and the Ar gas supply line 29 extending from the Ar gas supply source 23. Further, the $H_2$ gas supply line 30 extending from the $H_2$ gas supply source 24 is connected to the $NH_3$ gas supply line 30a extending from the $NH_3$ gas supply source 25, the $N_2$ gas supply line 30c extending from the $N_2$ gas supply source 26 and the $ClF_3$ gas supply line 30b extending from the $ClF_3$ gas supply source 21. The $TiCl_4$ gas supply line 28 and the $H_2$ gas supply line 30 are connected to a gas mixing unit 47, and a mixed gas in the gas mixing unit 47 flows to the gas inlet opening 16 through a gas line 48. The mixed gas reaches the gas diffusion space 14 through the gas inlet opening 16 and is injected toward the wafer W in the chamber through the gas injection openings 15 of the shower plate 12.

Further, the shower head 10 may be of a post-mix type in which $TiCl_4$ gas and $H_2$ gas are individually supplied into the chamber 1.

As for the nitriding gas, $N_2$ gas, $H_2$ gas or $NH_3$ gas may be used. Further, another inert gas may be used instead of Ar gas.

A high frequency power supply 34 is connected to the shower head 10 through a matching unit 33, and a high frequency power is supplied to the shower head 10 from the high frequency power supply 34. By supplying the high frequency power from high frequency power supply 34, the gas supplied into the chamber 1 through the shower head 10 becomes plasma and the film forming process is carried out.

Moreover, a heater 45 for heating the shower head 10 is disposed at the base member 11 of the shower head 10. A heater power supply 46 is connected to the heater 45. By supplying power to the heater 45 from the heater power supply 46, the shower head 10 is heated to a desired temperature. A heat insulating member 49 is disposed at the recess formed at an upper portion of the base member 11 in order to improve the heating efficiency of the heater 45.

A circular hole 35 is formed at the central portion of the bottom wall 1b of the chamber 1, and a downwardly protruding gas exhaust chamber 36 is provided at the bottom wall 1b so as to cover the circular hole 35. A gas exhaust line 37 is connected at a side surface of the gas exhaust chamber 36, and a gas exhaust unit 38 is connected to the gas exhaust line 37. Further, the pressure in the chamber 1 may be reduced to a predetermined vacuum level by operating the gas exhaust unit 38.

Three (only two are shown) wafer support pins 39 for supporting and vertically moving the wafer W are provided at the susceptor 2 in such a way that they can protrude and retract with respect to the surface of the susceptor 2. The wafer support pins 39 are supported by a support plate 40. Moreover, the wafer support pins 39 are vertically moved via the support plate 40 by a driving unit 41 such as an air cylinder or the like.

Provided at the sidewall of the chamber 1 are a loading/unloading port 42 for loading/unloading the wafer W between the chamber 1 and a wafer transfer chamber (not shown) adjacent to the chamber 1 and a gate valve 43 for opening/closing the loading/unloading port 42.

The components of the film forming apparatus 100 such as the heater power supplies 6 and 46, the valve 31, the mass flow controller 32, the matching unit 33, the high frequency power supply 34, the driving unit 41 and the like are connected to and controlled by a control unit 50 including a microprocessor (computer). The control unit 50 is connected to a user interface 51 such as a keyboard for an operator to perform an input operation of a command for managing the film forming apparatus 100, or a display for visualizing and displaying the operation state of the film forming apparatus 100. Further, a storage unit 52 for storing a program for realizing various processes performed by the film forming apparatus 100 under the control of controller 50, or a program, i.e., a processing recipe, for allowing the respective components of the film forming apparatus 100 to perform processes in accordance with processing conditions. The processing recipe is stored in a storage medium 52a of the storage unit 52. The storage medium 52a may be a fixed one such as a hard disk, or a portable one such as a CDROM, a DVD or the like. Alternatively, the process recipe may be transmitted from other devices via a dedicated line, for example. If necessary, a desired process recipe may be called from the storage unit 52 by a command from the user interface 51 and executed by the control unit 50, thereby performing a desired process in the film forming apparatus 100 under the control of control unit 50.

Hereinafter, the TiN film forming method of the present embodiment in the film forming apparatus 100 configured as described above will be described.

Figure 2:
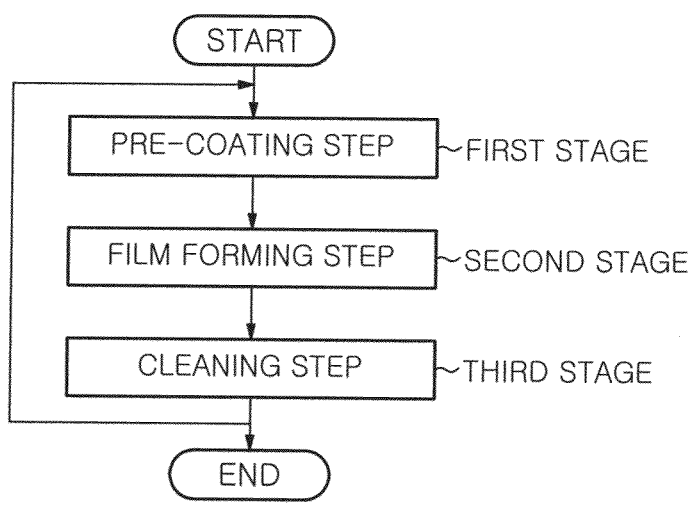
FIG. 2 is a flow chart describing the TiN film forming method in accordance with the embodiment of the present invention.

In the TiN film forming method of the present embodiment, a pre-coating step (first stage), a film forming step (second stage), and a cleaning step (third stage) are repeatedly performed, as shown in FIG. 2. In the pre-coating step as the first stage, a TiN film is pre-coated on a chamber wall or a surface of an in-chamber member in a state where no wafer exists in the chamber 1. In the film forming step as the second stage, a process of forming a TiN film on the surface of the wafer W in the chamber 1 is repeatedly performed on a predetermined number of wafers W after the pre-coating. In the cleaning step as the third stage, the inside of the chamber 1 is dry-cleaned by $ClF_3$ gas in a state where no wafer exists in the chamber 1 after the film forming process.

After the first to the third stage are repeated a predetermined number of times, the inside of the chamber is wet-cleaned by liquid chemical such as ammonia or the like.

In the pre-coating step as the first stage, the inside of the chamber 1 where no wafer exists is exhausted to vacuum by the gas exhaust unit 38. Ar gas from the Ar gas supply source 23 is introduced into the chamber 1 through the shower head 10, and the inside of the chamber 1 is preliminarily heated to 325° C. to 450° C. by the heater 5. When the temperature becomes stable, $TiCl_4$ gas, $N_2$ gas, $H_2$ gas and Ar gas are introduced at predetermined flow rates into the chamber 1 through the shower head 10 and converted to a plasma by supplying a high frequency power from the high frequency power supply 34. A TiN film is pre-coated on the inner wall of the chamber 1, the inner wall of the gas exhaust chamber 36 and the surface of the shower head 10 or the like. The TiN film may be pre-coated by using a SFD method of repeating multiple times a cycle of alternately performing a step of forming a TiN pre-coating unit film by generating a plasma of $TiCl_4$ gas, $N_2$ gas, $H_2$ gas and Ar gas introduced into the chamber 1 and a step of nitriding the formed TiN pre-coating unit film by generating a plasma of $N_2$ gas, $H_2$ gas and Ar gas. Although the number of cycles is not particularly limited, it is preferably 25 to 500 cycles and more preferably 50 to 300 cycles, e.g., 100 cycles. Further, $N_2$ gas, $H_2$ gas and $NH_3$ gas may be used for the plasma nitriding process instead of using only $N_2$ gas and $H_2$ gas. Moreover, the plasma nitriding process is not essential, and only the TiN film forming step may be performed.

Upon completion of the pre-coating step, the film forming step as the second stage is executed. In the second stage, the TiN film forming process is repeatedly performed on a single wafer W, as described above. The following is description of the film forming process for a single wafer W.

The gate valve 43 is opened, and a wafer W is loaded from the wafer transfer chamber (not shown) into the chamber 1 through a loading/unloading port 42 by a transfer unit (not shown) to be mounted on the susceptor 2. Further, the wafer W is preliminarily heated to a film forming temperature by the heater 5 while supplying Ar gas into the chamber 1. The TiN film formation is started when the temperature of the wafer becomes stable.

Figure 3:
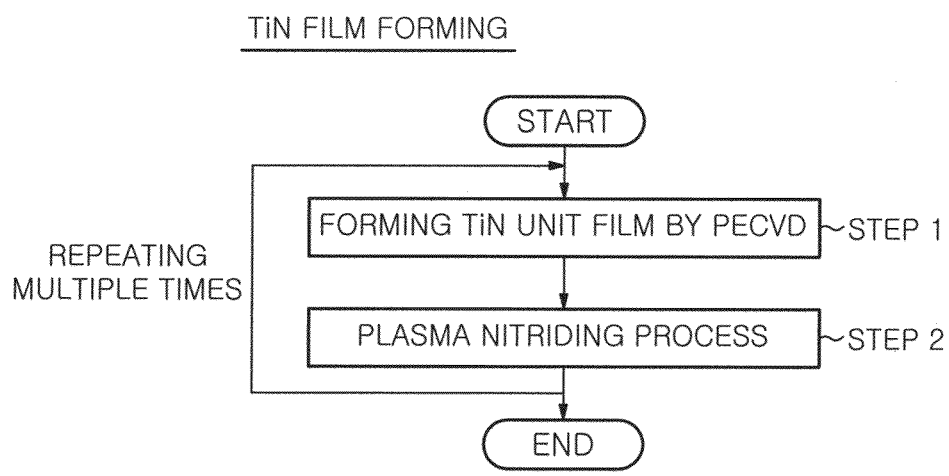
FIG. 3 is a flow chart describing an example of a single TiN film forming process in the TiN film forming method in accordance with the embodiment of the present invention.

In order to form a TiN film on the wafer W, a process of forming a TiN unit film by PECVD (step 1) and a plasma nitriding process using $N_2$ gas and $H_2$ gas (step 2) are repeated multiple times, as shown in FIG. 3. As a consequence, a TiN film of a predetermined film thickness is formed. At this time, the susceptor 2 and the shower head 10 are heated to predetermined temperatures by the heaters 5 and 45, respectively.

In the TiN unit film formation by PECVD of the step 1, the wafer W is heated and a high frequency power of, e.g., 13.56 MHz, is applied from the high frequency power supply to the shower head 10. Further, $TiCl_4$ gas as a film forming material, $N_2$ gas as a nitriding gas, $H_2$ gas and Ar gas are introduced and turned into a plasma, and a TiN unit film is formed. $N_2$ gas, $H_2$ gas and $NH_3$ gas may be used as the nitriding gas instead of using only $N_2$ gas and $H_2$ gas.

In the plasma nitriding process of the step 2, the wafer W is heated and a high frequency power of, e.g., 13.56 MHz, is applied from the high frequency power supply 34 to the shower head 10. Further, $N_2$ gas, $H_2$ gas and Ar gas are introduced and turned into a plasma thereof. Accordingly, a plasma nitriding process is performed, and nitriding of the TiN unit film is facilitated. $N_2$ gas, $H_2$ gas and $NH_3$ gas may be used as the nitriding gas instead of using only $N_2$ gas and $H_2$ gas. Further, the plasma nitriding process of the step 2 is not essential, and only the step 1 may be executed.

A purge process may be performed between the step 1 and the step 2 by supplying N$_2$ gas, H$_2$ gas and Ar gas without generating a plasma. The steps 1 and 2 may be consecutively performed without performing a purge process. When the plasma state in the step 1 is different from that in the step 2, the setting of the matching unit 33 (the setting of the variable capacitor) is switched. Or, the setting of the matching unit 33 may be controlled while maintaining the plasma between the step 1 and the step 2.

The following is description of desired conditions of the steps 1 and 2. Numerical values in the brackets indicate more preferable ranges.

(Step 1)
- Susceptor temperature: 325 to 450° C. (350 to 400° C.), e.g., 385° C.
- Shower head temperature: 300 to 600° C. (400 to 550° C.), e.g., 500° C.
- Pressure: 13.3 to 1330 Pa (133 to 800 Pa), e.g., 260 Pa
- TiCl$_4$ flow rate: 5 to 200 mL/min(sccm) (15 to 50 mL/min (sccm)), e.g., 33 mL/min(sccm)
- Ar flow rate: 5 to 10000 mL/min(sccm) (100 to 5000 mL/min(sccm)), e.g., 400 mL/min(sccm)
- H$_2$ flow rate: 5 to 10000 mL/min(sccm) (30 to 5000 mL/min(sccm)), e.g., 4000 mL/min(sccm)
- N$_2$ flow rate: 1 to 5000 mL/min(sccm) (10 to 1000 mL/min (sccm)), e.g., 500 mL/min(sccm)
- NH$_3$ flow rate: 10000 mL/min(sccm) or less (5000 mL/min (sccm) or less), e.g., 0 mL/min(sccm)
- High frequency power: 100 to 5000 W (300 to 3000 W), e.g., 1350 W
- Time for single film formation: 0.5 to 120 sec (1.5 to 60 sec), e.g., 3.9 sec
- Film thickness obtained by single film formation: 0.1 to 50 nm (1 to 15 nm)

(Step 2)
- Susceptor temperature: 325 to 450° C. (350 to 400° C.), e.g., 385° C.
- Shower head temperature: 300 to 600° C. (400 to 550° C.), e.g., 500° C.
- Pressure: 13.3 to 1330 Pa (133 to 800 Pa), e.g., 260 Pa
- Ar flow rate: 5 to 10000 mL/min(sccm) (100 to 5000 mL/min(sccm)), e.g., 400 mL/min(sccm)
- H$_2$ flow rate: 5 to 10000 mL/min(sccm) (30 to 5000 mL/min(sccm)), e.g., 4000 mL/min(sccm)
- N$_2$ flow rate: 1 to 5000 mL/min(sccm) (10 to 1000 mL/min (sccm)), e.g., 500 mL/min(sccm)
- NH$_3$ flow rate: 10000 mL/min(sccm) or less (5000 mL/min (sccm) or less), e.g., 0 mL/min(sccm)
- High frequency power: 100 to 5000 W (300 to 3000 W), e.g., 1350 W
- Time for single nitriding process: 0.1 to 60 sec (0.5 to 30 sec), controlled by a film stress in the step 1, e.g., 2 sec Although the repetition number of the steps 1 and 2 varies in accordance with a target film thickness and time of the step 1, it is preferably 1 to 25 times and more preferably 3 to 10 times. For example, a TiN film having a film thickness of 40 nm can be obtained by repeating the steps 1 and 2 seven times.

Since the TiN film is formed by using a plasma of TiCl$_4$ gas and a nitriding gas, the reactivity between Ti and N is improved. Even when the film formation is performed at a low temperature of about 400° C. or less, strong Ti—N bond can be obtained, and the concentration of impurities (Cl or the like) in the film can be reduced. By performing the plasma nitriding process after the formation of the TiN unit film, it is possible to enhance the nitriding, further reduce the concentration of impurities (Cl or the like) in the film, and reduce the film stress. Moreover, the stress may be varied within a range from a compressive stress to a tensile stress, e.g., to about 1 to 3 GPa. The TiN film of the present embodiment which is obtained by repeating such processes is suitable for a metal hard mask due to the strong Ti—N bond. An excellent TiN film having low stress and small amount of impurities can be obtained by properly controlling the film thickness obtained by single TiN unit film formation, the nitriding time, the number of repetition of the steps 1 and 2 or the like.

After the TiN film having a predetermined thickness is formed by repeating the steps 1 and 2, the supply of the gas and the high frequency power is stopped. Then, the gate valve 43 is opened, and the wafer W after the film formation is unloaded through the loading/unloading port 42.

Such a film forming process is repeatedly performed on a plurality of wafers W. However, it has been found that when the number of wafers W reaches about 150, the number of particles is increased. If the number of particles is increased, it is required to perform dry cleaning in the chamber 1. However, if the cleaning is performed for a short period of time, the frequency of the cleaning is increased, which results in the decrease of the throughput.

The particle generation mechanism is considered as follows.

Figure 4A:
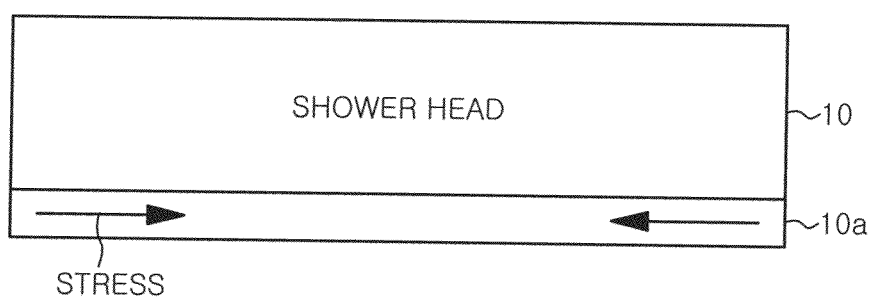
FIGS. 4A and 4B illustrate particle generation mechanism.
Figure 4B:
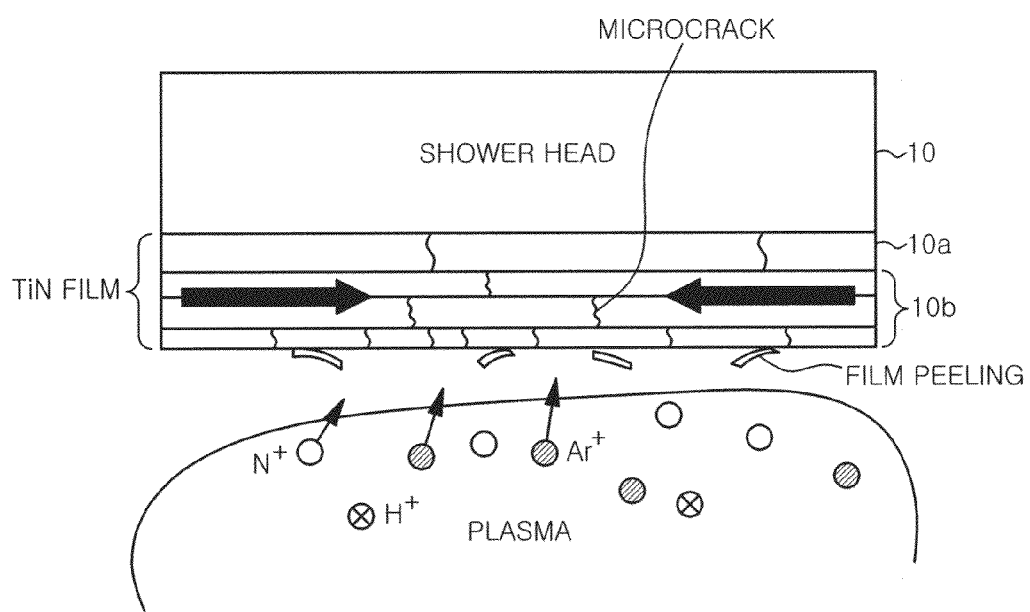

As shown in FIG. 4A, a pre-coat film 10a formed of a TiN film is formed on the component in the chamber 1, e.g., the surface of the shower head 10. This pre-coat film 10a has a small film stress. If the film forming process is repeatedly performed on the wafers, a TiN film 10b is deposited, as a by-product, on the pre-coat film 10a. Accordingly, the pre-coating film 10a becomes thicker and the stress inside the film is increased. If the impact by ions or radicals in the plasma or by electrons is inflicted on the pre-coating film 10a, microcracks are generated as shown in FIG. 4B. If this state is continued, fine film peeling occurs by the coupling of the microcracks and a large film stress, which results in generation of particles. The film peeling easily occurs at a portion where nitriding is insufficient.

Figure 5:
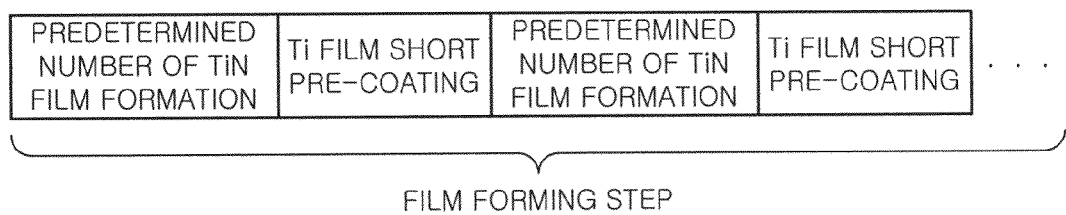
FIG. 5 explains a film forming step in the TiN film forming method in accordance with the embodiment of the present invention.

Here, in the present embodiment, in the film forming step as the second stage, when the TiN film is repeatedly formed on a predetermined number of wafers W, the Ti film short pre-coating is performed once or more to suppress particle generation caused by film peeling, as shown in FIG. 5. The Ti film short pre-coating is a process of forming a thin Ti film on the inner wall of the chamber 1 and on the in-chamber members in a state where no wafer exists in the chamber 1. By performing the Ti film short pre-coating, the film peeling from the inner wall of the chamber 1 and the in-chamber members is suppressed. The short pre-coating is preferably started before particles are generated. Specifically, the number of the processed wafers W at which the particle generation is started (150 wafers in the present embodiment) is checked in advance, and the short pre-coating is performed before the 150 wafer W are processed.

Figure 6:
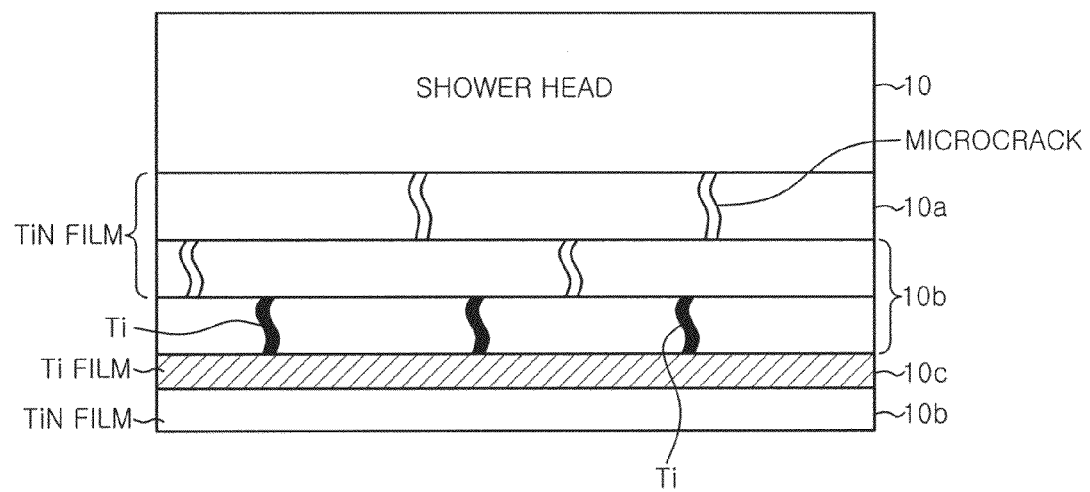
FIG. 6 explains particle suppression mechanism by Ti film short pre-coating executed in the film forming step in the TiN film forming method in accordance with the embodiment of the present invention.

As shown in FIG. 6, by performing the Ti film short pre-coating in a state where particles are not generated, the microcracks existing in the TiN pre-coating film 10a and in the TiN film 10b deposited as a by-product can be filled by a Ti film 10c. As will be described later, the Ti film is formed by a CVD method such as a PECVD method, so that a good step coverage is obtained. Further, the Ti film is made of metal and thus has a high softness and extensibility. The particle generation caused by the peeling of the TiN film can be suppressed by filling the microcracks by the Ti film 10c. Moreover, as will be described later, the Ti film short pre-coating is performed by PECVD using TiCl$_4$ gas or the like, so that the portion of the TiN film where nitriding is insufficient and peeling easily occurs can be removed by etching using Cl generated at that time. Accordingly, the particle generation that occurs during the formation of the TiN film on the wafer can be suppressed. By supplying only $TiCl_4$ gas and an inert gas in a state where no wafer exists in the chamber 1 immediately before the formation of the Ti film, the portion of the TiN film where nitriding is insufficient and peeling easily occurs can be actively removed by etching.

Due to the short pre-coating, the Ti film is formed on the inner wall of the chamber 1 and the surfaces of the susceptor 2 and the shower head 10 that are the in-chamber members. The film is easily peeled off from the surface of the shower head 10 as a gas injection member, especially from the inner surface of the gas diffusion space 14. Therefore, the pre-coating for the shower head 10 is particularly important.

The film thickness of the Ti film in the short pre-coating does not need to be thick in view of suppressing particle generation by filling the cracks of the TiN film, and is preferably 0.1 nm to 50 nm and more preferably 1 nm to 15 nm, e.g., 2 nm, 5 nm or 10 nm. If the thickness of the Ti film is excessively thin, the effect of suppressing particle generation by the Ti film formation cannot be obtained. If the thickness of the Ti film is excessively thick, the throughput is decreased or the particles are generated from the Ti film, which is not preferable.

Figure 7:
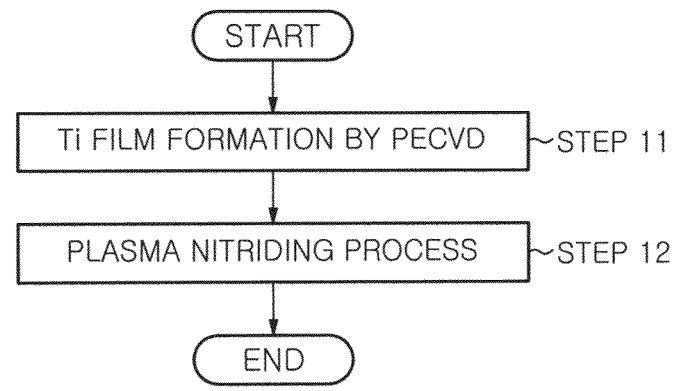
FIG. 7 is a flow chart describing the short pre-coating.

As shown in FIG. 7, the Ti film short pre-coating includes Ti film formation by PECVD (step 11) and a plasma nitriding process (step 12). The Ti film formation of the step 11 and the plasma nitriding process of the step 12 may be repeated twice or more. Further, the plasma nitriding process may be omitted.

In the Ti film formation by PECVD of the step 11, the wafer W is heated and a high frequency power of, e.g., 13.56 MHz, is applied from the high frequency power supply 34 to the shower head 10. Further, $TiCl_4$ gas as a film forming material, $H_2$ gas as a reduction gas, and Ar gas are introduced and converted to a plasma, and a Ti film is formed. As for the reduction gas, another gas such as deuterium or the like may be used.

In the plasma nitriding process of the step 12, the wafer W is heated and a high frequency power of, e.g., 13.56 MHz, is applied from the high frequency power supply 34 to the shower head 10. Further, $NH_3$ gas, $H_2$ gas and Ar gas are introduced and converted to a plasma, and a plasma nitriding process is performed. Accordingly, the surface of the Ti film is nitrided. As for the nitriding gas, $N_2$ gas may be used instead of $NH_3$ gas. Further, the Ti film nitriding process may be executed by thermal reaction using a nitriding gas without using a plasma. Moreover, the nitriding process may be omitted.

The preferred conditions of the steps 11 and 12 are described as follows. Numerical values in the brackets indicate more preferable ranges.

(Step 11)
Susceptor temperature: 325 to 450° C. (350 to 400° C.), e.g., 385° C.
Shower head temperature: 300 to 600° C. (400 to 550° C.), e.g., 500° C.
Pressure: 13.3 to 1330 Pa (133 to 800 Pa), e.g., 666 Pa
$TiCl_4$ flow rate: 1 to 200 mL/min(sccm) (5 to 50 mL/min (sccm)), e.g., 6.7 mL/min(sccm)
Ar flow rate: 5 to 10000 mL/min(sccm) (100 to 5000 mL/min(sccm)), e.g., 800 mL/min(sccm)
$H_2$ flow rate: 1 to 10000 mL/min(sccm) (10 to 5000 mL/min(sccm)), e.g., 4000 mL/min(sccm)
High frequency power: 100 to 5000 W (300 to 3000 W), e.g., 800 W
Time: 0.1 to 120 sec (1 to 60 sec), e.g., 30 sec (Step 12)
Susceptor temperature: 325 to 450° C. (350 to 400° C.), e.g., 385° C.
Shower head temperature: 300 to 600° C. (400 to 550° C.), e.g., 500° C.
Pressure: 13.3 to 1330 Pa (133 to 800 Pa), e.g., 666 Pa
Ar flow rate: 5 to 10000 mL/min(sccm) (100 to 5000 mL/min(sccm)), e.g., 800 mL/min(sccm)
$H_2$ flow rate: 1 to 10000 mL/min(sccm) (10 to 5000 mL/min(sccm)), e.g., 4000 mL/min(sccm)
$NH_3$ flow rate: 1 to 10000 mL/min(sccm) (10 to 5000 mL/min(sccm)), e.g., 500 mL/min(sccm)
High frequency power: 100 to 5000 W (300 to 3000 W), e.g., 800 W
Time: 0.1 to 300 sec (1 to 180 sec), e.g., 30 sec The particle generation by the peeling of the TiN film easily occurs especially at the shower head 10. Therefore, it may be required to increase the amount of Ti film formed on the shower head 10. In that case, it is preferable to increase the $TiCl_4$ flow rate (10 to 40 mL/min(sccm), (more preferably 12 to 30 mL/min(sccm)) to, e.g., about 18 mL/min(sccm)) and increase a pressure (300 to 1200 Pa, e.g., 1066 Pa). Especially when a high step coverage is required, it is preferable to increase the $TiCl_4$ flow rate (10 to 80 mL/min(sccm), (more preferably 15 to 50 mL/min(sccm)) to, e.g., 25 mL/min (sccm)) and decrease the $H_2$ flow rate (10 to 300 mL/min (sccm), e.g., 100 mL/min(sccm)).

After the short pre-coating is executed once, the film peeling may occur due to further deposition of the TiN film by the following film forming process. Therefore, it is preferable to repeatedly perform the short pre-coating after the film forming process is performed on a predetermined number of wafers. For example, it may be performed at every processing of a certain number of wafers, or may be performed in the unit of lot, e.g., once per one lot (25 wafers) or once for per two or more lots. In view of suppressing the particle generation, a higher frequency is preferable. Once per 50 wafers or less is preferable, and once per 25 wafers or less is more preferable. Once per 15 wafers or less and once per 10 wafers or less is further more preferable. Although it is most preferable to perform the short pre-coating per each wafer, it is important to balance the particle suppression effect and the throughput since the throughput is decreased if the frequency is too higher. For example, it is preferable to perform the short pre-coating once per 5 wafers, once per 10 wafers, or once per 15 wafers. Further, the number of processed wafers at which the short pre-coating is started is preferably smaller than the number of wafers at which the particle generation is started (150 wafers at the present embodiment). For example, the short pre-coating may be performed once per a predetermined number of wafers after 100 wafers are processed. Or, the short pre-coating may be performed once per a predetermined number of wafers after the film formation is started. Even when the short pre-coating is performed once and then again after the particle generation is started, or even when the short pre-coating is firstly performed after the particle generation is started, a certain level of effect can be obtained by the function of the short pre-coating.

During the film formation for a plurality of wafers, the film thickness (the number of cycles) of the short pre-coating or the frequency of the short pre-coating may be increased. Even if the short pre-coating is repeatedly performed under predetermined conditions, the number of particle starts to increase at a certain stage. At this time, the number of particles can be reduced by increasing the film thickness (the number of cycles) of the short pre-coating or the frequency of the short pre-coating. Simply, they may be increased before the number of particles starts to increase.

The Ti film short pre-coating may be performed once or more in the pre-coating step (first stage) that is executed before the film forming step (second stage). By performing the Ti film short pre-coating in the pre-coating step as the first stage, even when microcracks are generated on the TiN pre-coating film, the microcracks can be filled by the Ti film. As a result, the particle generation can be more effectively suppressed.

When the pre-coating in the pre-coating step is executed by a SFD method in which a cycle of a step of forming a TiN pre-coating unit film and a step of nitriding the TiN pre-coating unit film is repeated multiple times as described above, it is preferable to form a pre-coating film while adding the Ti film short pre-coating once per a predetermined number of cycles. In that case, if necessary, the timing of adding the short pre-coating may be controlled between one cycle and 100 cycles, for example, and preferably between 5 cycles to 25 cycles. Particularly, the short pre-coating is added once per 10 cycles.

In order to effectively suppress the particle generation without decreasing the throughput, the Ti film short pre-coating is preferably performed once per 5 to 25 cycles in the TiN film pre-coating of the pre-coating step. Then, it is preferably performed once per processing of 1 to 50 wafers and more preferably once per processing of 5 to 25 wafers in the film forming step after the Ti film short pre-coating. For example, there is provided, as a typical example, a method in which the Ti film short pre-coating is performed once per 10 cycles in the pre-coating step and once per processing of 10 wafers in the film forming step. Accordingly, the particle increase timing (the number of processed wafers by which the number of particles starts to increase) can be remarkably decreased compared to a method in which the Ti film short pre-coating is performed once per processing of 10 wafers in the film forming step without performing the Ti film short pre-coating in the pre-coating step.

TEST EXAMPLES

Hereinafter, the results of tests for examining the effect obtained by actually performing short pre-coating will be described.

Test Example 1

First, a surface state of the susceptor depending on execution or non-execution of Ti film short pre-coating was monitored.

Figure 8A:
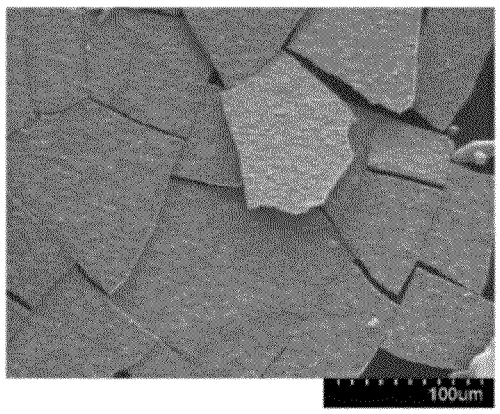
Figure 8B:
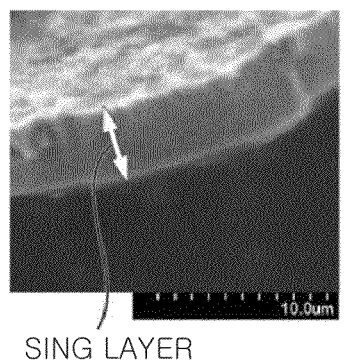

FIGS. 8A and 8B are SEM images showing a state of a film formed on the susceptor in the case of consecutively performing the TiN film formation on 200 wafers without performing short pre-coating after the TiN film pre-coating. FIG. 8A shows a surface state and FIG. 8B shows a cross sectional state. As shown in FIGS. 8A and 8B, when the short pre-coating was not performed, cracks were shown on the surface and the film peeling occurred. Further, the film has a single layer.

Figure 9A:
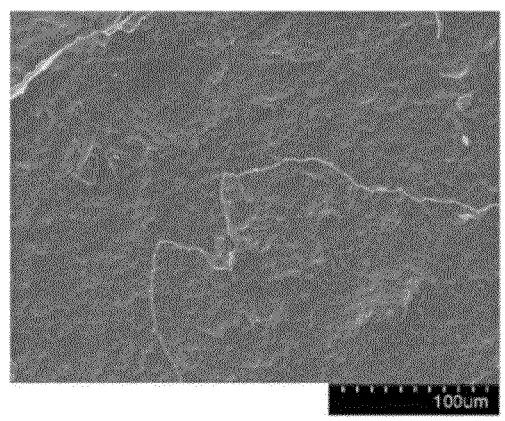
Figure 9B:
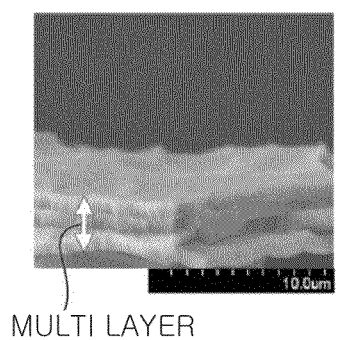

FIGS. 9A and 9B are SEM images showing a state of a film formed on the susceptor in the case of after the TiN film pre-coating forming Ti films on about 200 wafers by performing short pre-coating of a Ti film having a film thickness of 5 nm once per processing of 25 wafers during the TiN film formation, wherein FIG. 9A shows a surface state and FIG. 9B shows a cross sectional state. As shown in FIGS. 9A and 9B, when the short pre-coating was performed, cracks formed on the surface were filled and a consecutive film without peeling was obtained. Since the short pre-coating was repeatedly performed, the film has a multilayer structure.

From the above, it is clear that the film peeling can be suppressed and the consecutive film can be obtained by filling cracks of the TiN film deposited on the in-chamber member by the Ti film short pre-coating.

Test Example 2

Next, the number of particles existing on the TiN film of the wafer depending on execution or non-execution of the Ti film short pre-coating was monitored.

Figure 10:
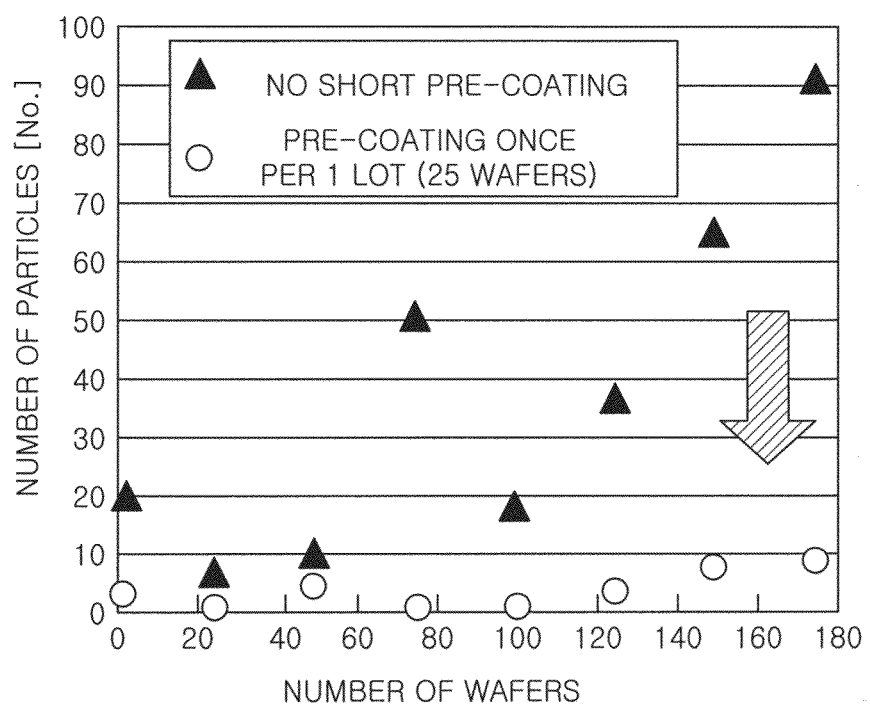
FIG. 10 shows a result of calculating the number of particles on the TiN film on the wafer in the case of performing Ti film short pre-coating and in the case of not performing the Ti film short pre-coating.

Here, the number of particles existing on the TiN film of the wafer was compared between the case of consecutively performing the TiN film pre-coating and the TiN film formation on the wafer without performing the short pre-coating by repeating the steps 1 and 2 seven times and the case of performing the short pre-coating once per processing of one lot of wafers (25 sheets). The short pre-coating was performed by forming a Ti film having a film thickness of 5 nm by executing one cycle of the steps 11 and 12 under the aforementioned conditions. The result thereof is shown in FIG. 10. The particles having a size greater than 0.08 µm were counted.

As shown in FIG. 10, when the short pre-coating was not performed, the number of particles was considerably increased when the processed number of processed wafers reached about 150. However, it has been found that by performing the short pre-coating, the number of particles was hardly increased even if the number of processed wafers exceeded 150.

Test Example 3

Then, the solution to the increase of the particles was examined.

Figure 11:
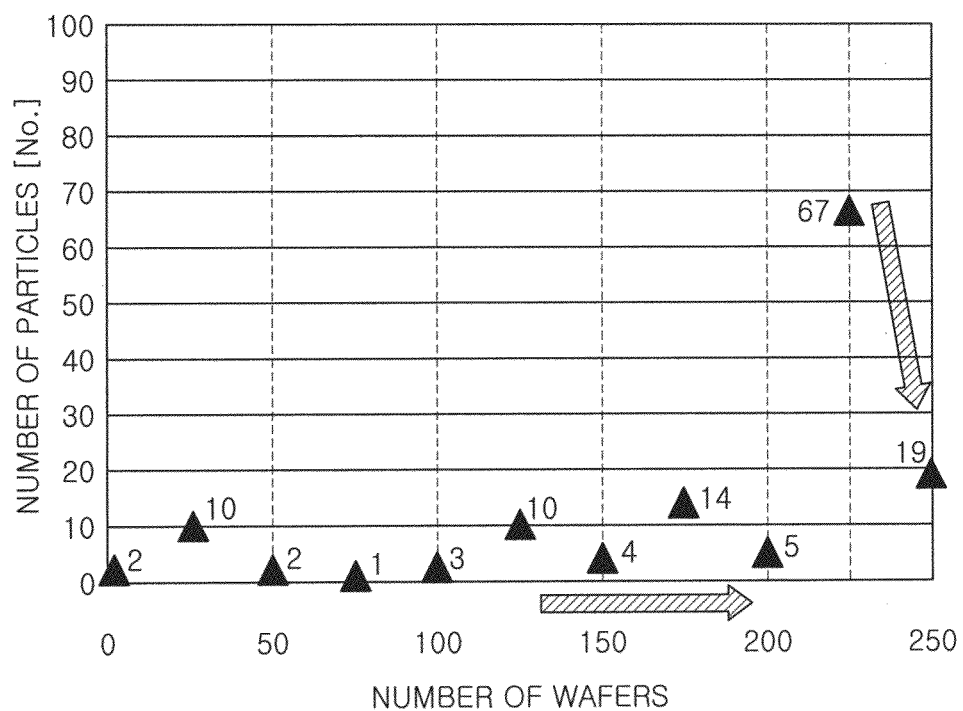
FIG. 11 shows relationship between the number of wafers and the number of particles on the TiN film in the case of performing Ti film short pre-coating once per 50 wafers and increasing a film thickness by increasing a Ti film formation cycle in the short pre-coating from one cycle (5 nm) to five cycles after the number of particles is increased.

Here, the TiN film was formed on the wafer after the TiN film pre-coating as in the case of the test example 2, and the short pre-coating of a Ti film having a film thickness of 5 nm (one cycle) was performed once per processing of 50 wafers under the same conditions as those of the test example 2. The film thickness was increased (total 25 nm) by increasing the cycle of the Ti film formation to five cycles during the short pre-coating after the number of particles was increased. The result thereof is shown in FIG. 11. As shown in FIG. 11, even if the short pre-coating was performed once per processing of 2 lots (50 sheets), the number of particles was increased to 67 when the number of processed wafers was 225 sheets. However, by increasing the Ti film thickness by performing five cycles of the Ti film formation during the short pre-coating, the number of particles was decreased to 19 when the number of processed wafers was 250.

Test Example 4

Next, the test of increasing the frequency of the short pre-coating after the number of particles was increased was executed.

Here, a shower head with gas injection openings having a large diameter, from which particles are easily generated, was used. After the TiN film pre-coating was executed, the TiN film was formed on the wafer as in the test example 2.

Then, the short pre-coating of a Ti film having a film thickness of 5 nm was performed once per processing of 25 wafers under the same conditions as those of the test example 2. After the number of particles was increased, the frequency of the short pre-coating was increased to once per 10 wafers.

Figure 12:
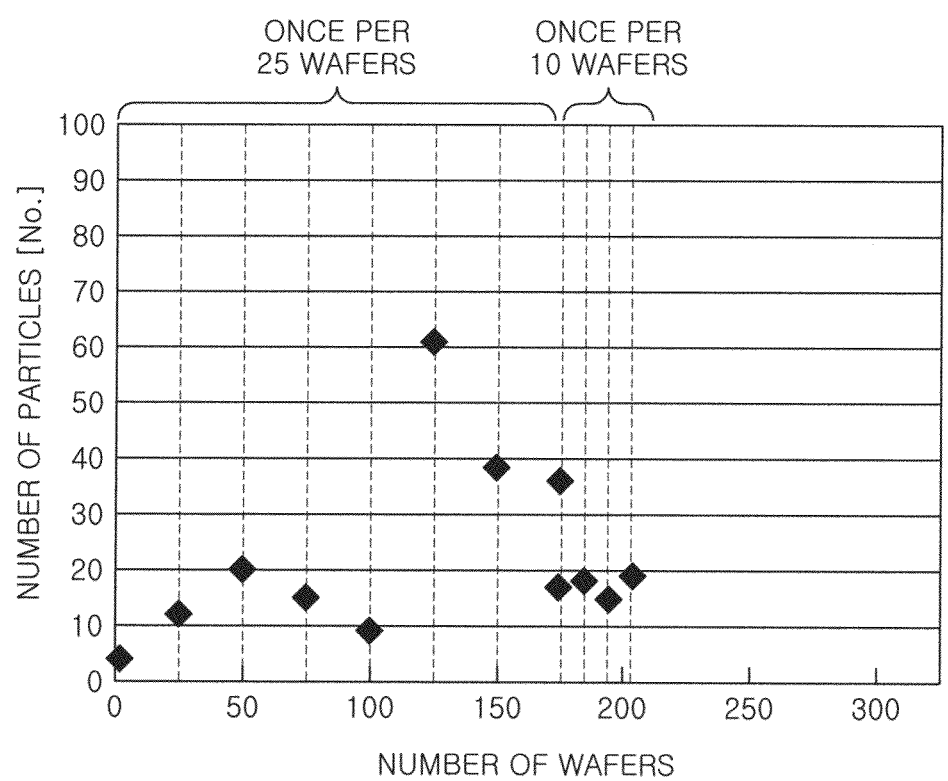
FIG. 12 shows relationship between the number of wafers and the number of particles on the TiN film in the case of performing Ti film short pre-coating once per 25 wafers and increasing the frequency of the short pre-coating to once per 10 wafers after the number of particles is increased.

The result thereof is shown in FIG. 12. As shown in FIG. 12, the frequency of the short pre-coating was increased to once per 10 wafers when the number of processed wafers reached 175, so that the number of particles was reduced when the number of processed wafers was 185, 195 and 205 sheets.

Test Example 5

Figure 13A:
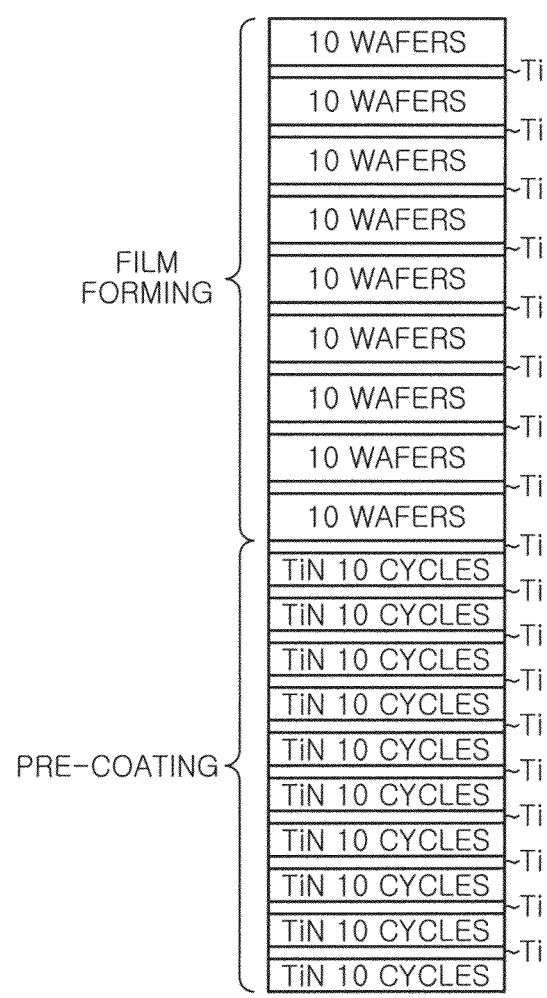
FIGS. 13A and 13B compare timing of performing the short pre-coating between the case of performing the Ti film short pre-coating from the pre-coating step in a test example 5 and the case of performing the Ti film short pre-coating from the film forming step.

Here, the inside of the chamber was cleaned by $ClF_3$ and, then, TiN pre-coating was executed by repeating 100 times a cycle of a step of introducing $TiCl_4$ gas, $N_2$ gas, $H_2$ gas and Ar gas into the chamber 1 and forming a thin TiN film by generating a plasma of those gases and a step of supplying $N_2$ gas, $H_2$ gas, and Ar gas and nitriding the formed thin TiN film by generating a plasma of those gases, as schematically shown in FIG. 13A. At this time, the Ti film short pre-coating was performed once per 10 cycles, so that the Ti film short pre-coating was performed 10 times in total. Then, in the film forming step, the short pre-coating was performed once per processing of 10 wafers, and the particle generation state on the TiN film was monitored. In this test example as well, the Ti film short pre-coating was executed by forming a Ti film having a film thickness of 5 nm by performing one cycle of the steps 11 and 12, and the process of forming a TiN film on the wafer was executed by repeating the steps 1 and 2 seven times. Further, the particles having a size greater than 0.08 μm were counted. The entire thickness of the pre-coating film (TiN film+Ti film) at this time was 417 nm.

Figure 13B:
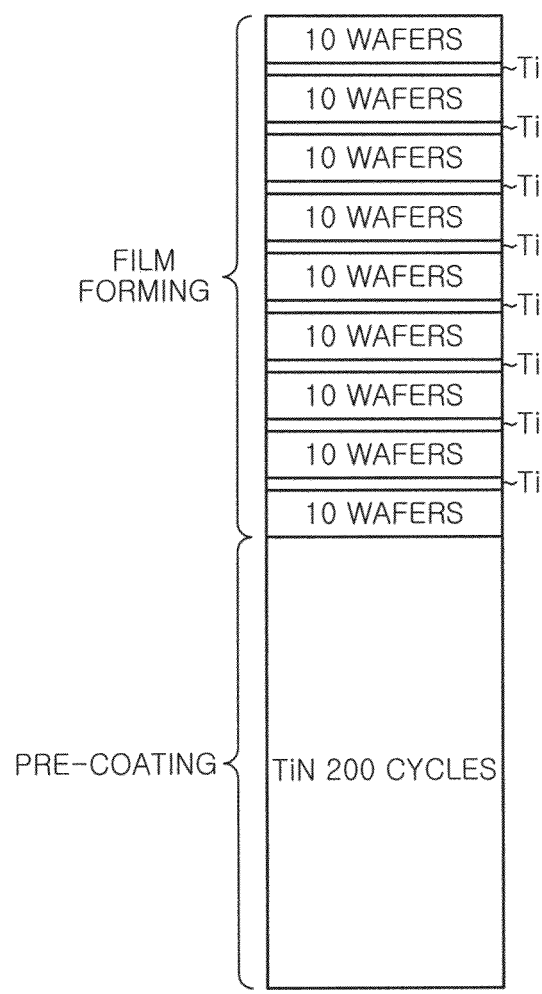

For comparison, the particle generation state on the TiN film was monitored by performing the short pre-coating once per processing of 10 wafers in the film forming step without the Ti film short pre-coating in the pre-coating step, as schematically shown in FIG. 13B. The pre-coating was executed 200 cycles, and the thickness of the Ti film short pre-coating was 2 nm. It was clear that the particle increase timings were not greatly different since the thicknesses of the Ti film short pre-coating were 2 nm and 5 nm.

Figure 14:
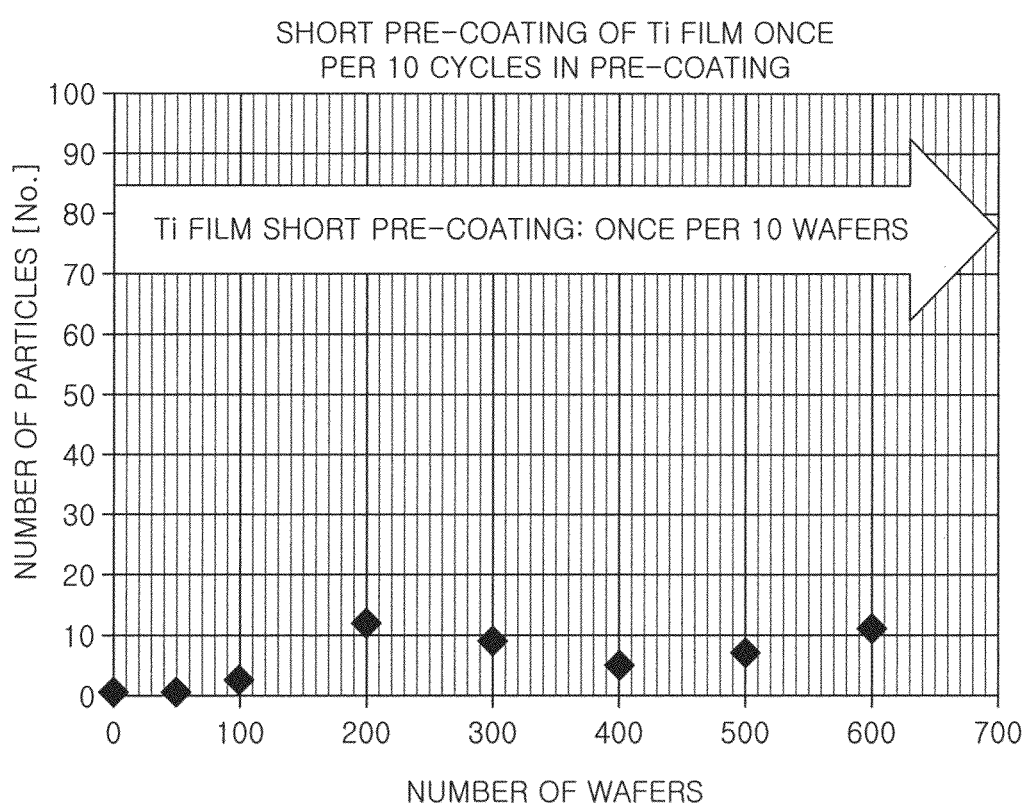
FIG. 14 shows relationship between the number of processed wafers and the number of particles on the TiN film in the case of performing the Ti film short pre-coating per 10 cycles in the pre-coating step and per 10 wafers in the film forming step.
Figure 15:
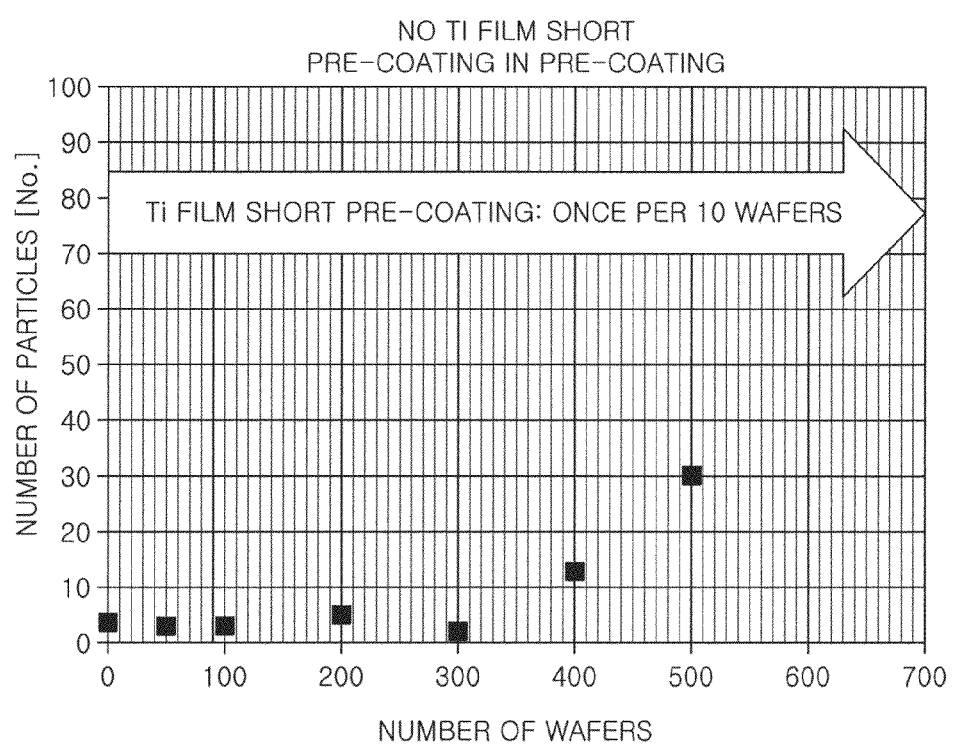
FIG. 15 shows relationship between the number of processed wafers and the number of particles on the TiN film in the case of not performing the Ti film short pre-coating in the pre-coating step and performing the Ti film short pre-coating per 10 wafers in the film forming step.

FIG. 14 shows relationship between the number of processed wafers and the number of particles on the TiN film in the case of performing the Ti film short pre-coating in the pre-coating step. FIG. 15 shows relationship between the number of processed wafers and the number of particles on the TiN film in the case of performing the Ti film short pre-coating in the film forming step.

As shown in FIG. 14, when the Ti film short pre-coating was performed in the pre-coating step, the number of particles having a size greater than 0.08 μm was smaller than or equal to 12 until the number of processed wafers reached 600, which showed extremely high particle suppression effect. On the other hand, when the Ti film short pre-coating was performed in the film forming step, the number of particles having a size greater than 0.08 μm was 13 when the number of processed wafers was 400, sheets and 30 when the number of processed wafers was 500. This shows that although the particle suppressing effect was obtained, the particle generation timing was earlier compared to the case of performing the Ti film short pre-coating in the pre-coating step.

The present invention is not limited to the above-described embodiment and may be variously modified. For example, the film forming apparatus of the above-described embodiment shown in FIG. 1 is merely an example, and the present invention is not limited to the apparatus of FIG. 1.

While the invention has been shown and described with respect to the embodiments, it will be understood by those skilled in the art that various changes and modification may be made without departing from the scope of the invention as defined in the following claims.

What is claimed is:

1. A TiN film forming method comprising the steps of:
   performing once or multiple times a TiN forming process including the sequential sub-steps of loading a substrate into a processing chamber, forming a TiN film on the substrate, and unloading the substrate from the processing chamber, and
   in a state where no substrate exists in the processing chamber, forming a Ti film on an inner surface of the processing chamber by using a processing gas supplied into the processing chamber,
   wherein the TiN forming process performing step and the Ti film forming step are performed repeatedly, and
   wherein a film thickness of the Ti film formed in a single Ti film forming step is increased as the number of repetitions of the Ti film forming step increases.

2. The TiN film forming method of claim 1, wherein the processing gas includes a $TiCl_4$ gas and a reduction gas, and the Ti film forming step includes generating a plasma of the processing gas.

3. The TiN film forming method of claim 2, wherein the Ti film forming step further includes nitriding a surface of the Ti film by a plasma of a nitriding gas.

4. The TiN film forming method of claim 1, wherein the TiN forming process is performed not greater than 50 times.

5. The TiN film forming method of claim 1, wherein the Ti film has a film thickness of 0.1 nm to 50 nm.

6. The TiN film forming method of claim 1, wherein the inner surface of the processing chamber on which the Ti film is formed includes a surface of a gas injection member configured to inject the processing gas into the processing chamber and provided in the processing chamber.

7. The TiN film forming method of claim 1, wherein the forming the TiN film in the TiN forming process performing step includes performing once or multiple times a cycle of alternately executing a step of forming a TiN unit film by using a plasma of a gaseous mixture of a $TiCl_4$ gas and a first nitriding gas and a step of performing a plasma nitriding process on the TiN unit film by using a plasma of a second nitriding gas.

8. A computer-executable storage medium storing a program for controlling a film forming apparatus, wherein the program, when executed, controls the film forming apparatus on a computer to perform the TiN film forming method described in claim 1.

9. The TiN film forming method of claim 1,
   wherein the TiN forming process is performed multiple times in the TiN forming process performing step and the number of repetitions of the TiN forming process is decreased as the number of repetitions of the TiN forming process performing step increases.

10. The TiN film forming method of claim 6,
    wherein a flow rate of the processing gas and a pressure of the processing chamber are controlled such that a film thickness of the Ti film formed on the surface of the gas injection member is thicker than that of the Ti film formed on the remaining inner surface of the processing chamber.

11. The TiN film forming method of claim 1, further comprising,
    performing pre-coating on the inner surface of the processing chamber in a state where no substrate exists in the processing chamber,
    wherein the pre-coating performing step includes forming a TiN film on the inner surface of the processing chamber and then forming a Ti film on the TiN film formed on the inner surface of the processing chamber.

12. The TiN film forming method of claim 11, wherein said forming the TiN film and said forming the Ti film are alternately performed once or multiple times in the pre-coating performing step, and wherein said forming the TiN film in the pre-coating performing step includes performing once or multiple times a cycle of alternately executing a step of forming a TiN pre-coating unit film by using a plasma of a gaseous mixture of a $TiCl_4$ gas and a first nitriding gas and a step of performing a plasma nitriding process on the TiN pre-coating unit film by using a plasma of a second nitriding gas.

13. The TiN film forming method of claim 12, wherein the cycle is performed not greater than 100 times.

14. The TiN film forming method of claim 12, wherein the cycle is performed 5 to 25 times, and the TiN forming process is performed not greater than 50 times.

15. The TiN film forming method of claim 14, wherein the cycle is performed 10 times, and the TiN forming process is performed 10 times.

16. The TiN film forming method of claim 11, wherein the steps of performing the TiN forming process, forming the Ti film and performing the pre-coating are carried out sequentially in that order.

17. The TiN film forming method of claim 16, further comprising, between the Ti film forming step and the pre-coating performing step, the sequential steps of:

repeating the TiN forming process performing step and the Ti film forming step; and cleaning the inner surface of the processing chamber.

* * * * *